United States Patent
Nguyen et al.

(10) Patent No.: US 10,038,456 B1
(45) Date of Patent: Jul. 31, 2018

(54) DECODERS WITH LOOK AHEAD LOGIC

(71) Applicant: Marvell International Ltd., Hamilton (BM)

(72) Inventors: Viet-Dzung Nguyen, San Jose, CA (US); Shashi Kiran Chilappagari, San Jose, CA (US); Nedeljko Varnica, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 202 days.

(21) Appl. No.: 14/667,579

(22) Filed: Mar. 24, 2015

Related U.S. Application Data

(60) Provisional application No. 61/969,923, filed on Mar. 25, 2014.

(51) Int. Cl.
  *H03M 13/00* (2006.01)
  *H03M 13/11* (2006.01)
  *H03M 13/37* (2006.01)

(52) U.S. Cl.
  CPC ... *H03M 13/1131* (2013.01); *H03M 13/3746* (2013.01)

(58) Field of Classification Search
  CPC .. H04L 1/0057; H04L 1/0041; H03M 13/116; H03M 13/1111; H03M 13/1137
  USPC .......................................................... 714/752
  See application file for complete search history.

(56) References Cited

U.S. PATENT DOCUMENTS

| | | | |
|---|---|---|---|
| 6,457,147 B1 | 9/2002 | Williams | |
| 6,642,862 B2 | 11/2003 | Boudry | |
| 7,441,178 B2 | 10/2008 | Xin | |
| 7,865,797 B2 * | 1/2011 | Eguchi | G11C 16/28 714/752 |
| 7,934,147 B2 * | 4/2011 | Lakkis | H03M 13/1117 714/800 |
| 8,155,247 B2 | 4/2012 | Koocrapaly | |
| 8,347,194 B2 | 1/2013 | No | |
| 8,458,536 B2 | 6/2013 | Yang | |
| 8,667,361 B1 | 3/2014 | Varnica | |
| 8,677,225 B1 | 3/2014 | Weiner | |
| 8,713,399 B1 * | 4/2014 | Tsatsaragkos | H03M 13/1111 714/752 |

(Continued)

OTHER PUBLICATIONS

Nedeljko Varnica, U.S. Appl. No. 13/673,371, filed Nov. 9, 2012, entitled "Methodology for Improved Bit-Flipping Decoder in 1-Read and 2-Read Scenarios", 77 pages.

*Primary Examiner* — Albert Decady
*Assistant Examiner* — Enam Ahmed

(57) ABSTRACT

Systems, devices, and techniques relating to signal decoding are described. A describe device includes decoder circuitry configured to selectively update variable and check nodes to decode received information associated with a codeword, and selectively update a first group of the variable nodes and a first group of the check nodes in a first clock cycle; and look ahead circuitry configured to access, in the first clock cycle, a second group of the check nodes that are associated with a second group of the variable nodes, and generate node selection information, based on the second group of the check nodes, to indicate whether one or more variable nodes of the second group of the variable nodes are to be skipped or processed by the decoder circuitry in a second clock cycle based on their respective one or more likelihoods of being changed.

20 Claims, 7 Drawing Sheets

(56) References Cited

U.S. PATENT DOCUMENTS

| | | | |
|---|---|---|---|
| 8,887,032 B1 | 11/2014 | Varnica | |
| 9,009,578 B1 | 4/2015 | Varnica | |
| 2004/0240590 A1* | 12/2004 | Cameron | H03M 13/1102 |
| | | | 375/340 |
| 2007/0089019 A1* | 4/2007 | Tang | H03M 13/1102 |
| | | | 714/752 |
| 2009/0177943 A1 | 7/2009 | Silvus | |
| 2011/0083058 A1* | 4/2011 | Hu | H03M 13/1142 |
| | | | 714/758 |
| 2011/0246862 A1 | 10/2011 | Graef | |
| 2012/0054576 A1* | 3/2012 | Gross | H03M 13/1117 |
| | | | 714/752 |
| 2012/0110410 A1 | 5/2012 | Chilappagari | |
| 2013/0305114 A1* | 11/2013 | Olcay | H03M 13/1108 |
| | | | 714/755 |
| 2014/0229792 A1 | 8/2014 | Varnica | |
| 2015/0058692 A1* | 2/2015 | Bennatan | H03M 13/1111 |
| | | | 714/752 |

* cited by examiner

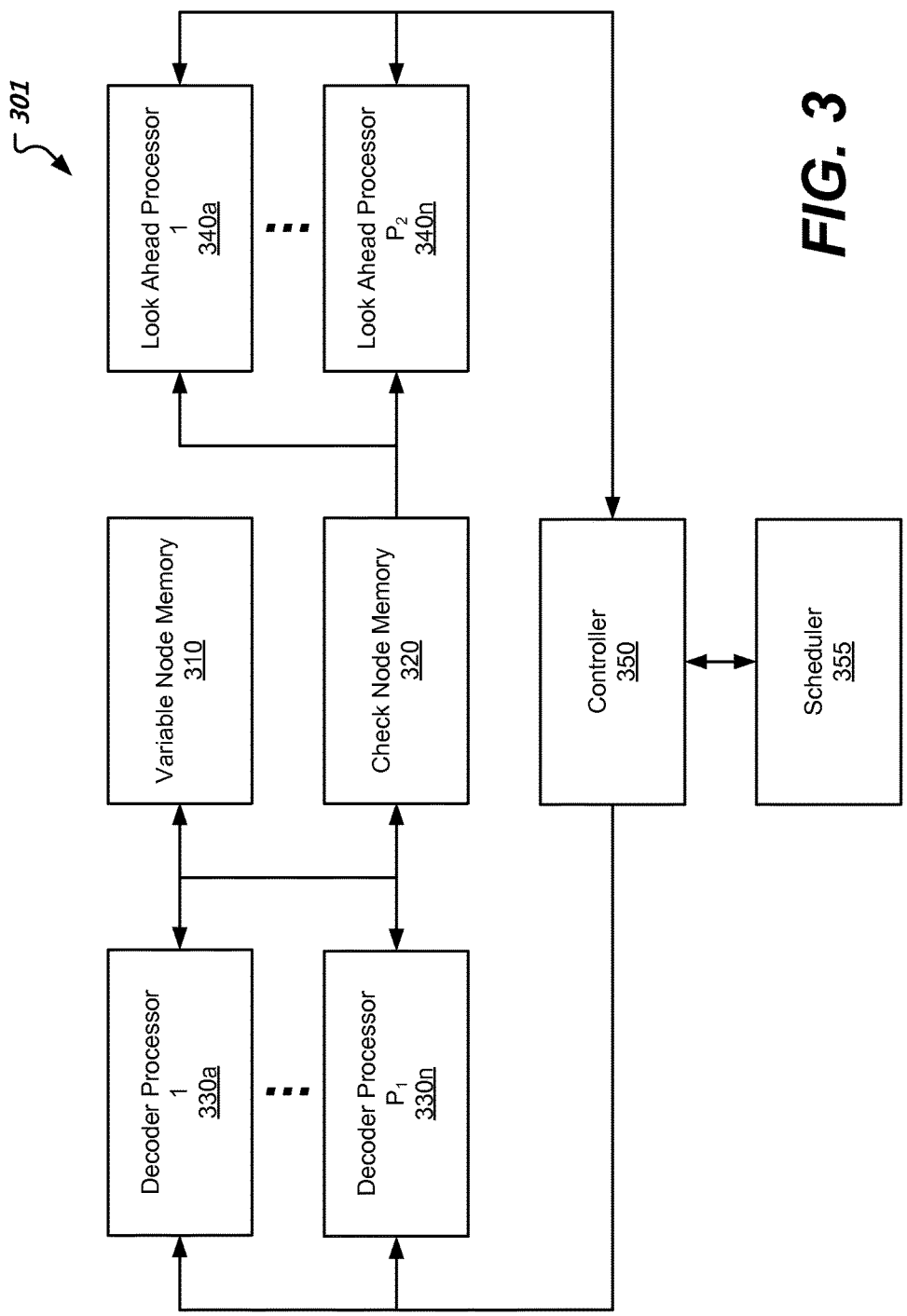

DECODERS WITH LOOK AHEAD LOGIC

CROSS REFERENCE TO RELATED APPLICATIONS

This disclosure claims the benefit of the priority of U.S. Provisional Application Ser. No. 61/969,923, filed Mar. 25, 2014. The above-identified application is incorporated herein by reference in its entirety.

BACKGROUND

Encoding techniques based on error detection or error correction codes such as low density parity check (LDPC) codes or Turbo codes can safeguard data over channels such as wireless communications channels or storage medium channels by including parity information in addition to the data to be transmitted or stored. Decoding techniques can detect errors, reconstruct corrupted data, or both. For example, LDPC based decoders can correct one or more errors caused via channel corruption, e.g., noisy channel, multi-path issues, defects in a read head, or defects in a storage medium. Various application areas such as data storage, satellite communications, wireless communications, wire-line communications, and power-line communications can use LDPC based encoders and decoders.

SUMMARY

The present disclosure includes systems, devices, and techniques related to decoding technology. According to an aspect of the described systems, devices, and techniques, a described device includes include a first memory to store values for variable nodes associated with received information associated with a codeword; a second memory to store values for check nodes associated with the variable nodes; decoder circuitry coupled with the first memory and the second memory, and configured to selectively update the variable nodes and the check nodes to decode the received information, the decoder circuitry being configured to selectively update a first group of the variable nodes and a first group of the check nodes in a first clock cycle; and look ahead circuitry coupled with the second memory and the decoder circuitry. The look ahead circuitry can be configured to access, in the first clock cycle, a second group of the check nodes that are associated with a second group of the variable nodes, and generate node selection information based on the second group of the check nodes. The node selection information can indicate whether one or more variable nodes of the second group of the variable nodes are to be skipped or processed by the decoder circuitry in a second clock cycle based on their respective one or more likelihoods of being changed.

These and other implementations can include one or more of the following features. The look ahead circuitry can be configured to access, from the second memory, check node values that are associated with a target variable node of the second group of the variable nodes, determine a number of unsatisfied conditions based on the check node values associated with the target variable node, and determine whether to skip or process the target variable node in the second clock cycle based on the number of unsatisfied conditions. The look ahead circuitry can be configured to cause the target variable node to be processed by the decoder circuitry in the second clock cycle based on the number of unsatisfied conditions exceeding a threshold value, and cause the target variable node to be skipped by the decoder circuitry in the second clock cycle based on the number of unsatisfied conditions not exceeding the threshold value. The look ahead circuitry can be configured to determine the threshold value based on whether the target variable node was changed in a previous clock cycle. The decoder circuitry can be configured to perform LDPC decoding on the received information. Implementations can include an integrated circuit chip, where the integrated circuit chip includes the decoder circuitry and the look ahead circuitry. In some implementations, the decoder circuitry can include the look ahead circuitry. The received information can be associated with a storage medium, wireless medium, or wireline medium.

A technique for decoding information can include operating a decoder to selectively update a first group of variable nodes and a first group of check nodes in a first clock cycle to decode received information associated with a codeword, wherein the variable nodes are associated with the codeword, and wherein the check nodes are associated with the variable nodes; accessing, in the first clock cycle, a second group of the check nodes that are associated with a second group of the variable nodes; generating node selection information based on the second group of the check nodes, wherein the node selection information indicates whether one or more variable nodes of the second group of the variable nodes are to be skipped or processed by the decoder in a second clock cycle based on their respective one or more likelihoods of being changed; and operating the decoder based on the node selection information in the second clock cycle to continue to decode the received information.

A system for decoding information can include circuitry to receive information associated with a codeword; a memory to store values for variable nodes associated with the information associated with the codeword and values for check nodes associated with the variable nodes; and a decoder coupled with the circuitry and configured to use variable nodes, the decoder including decoder circuitry and look ahead circuitry. The decoder circuitry can be configured to selectively update the variable nodes and the check nodes to decode the information associated with the codeword, wherein the decoder circuitry is configured to selectively update a first group of the variable nodes and a first group of the check nodes in a first clock cycle. The look ahead circuitry can be configured to access, in the first clock cycle, a second group of the check nodes that are associated with a second group of the variable nodes, and generate node selection information based on the second group of the check nodes. The node selection information can indicate whether one or more variable nodes of the second group of the variable nodes are to be skipped or processed by the decoder circuitry in a second clock cycle based on their respective one or more likelihoods of being changed. The memory can include a first memory associated with the variable nodes and a second memory associated with the check node. The look ahead circuitry can be coupled with the second memory. In some implementations, the look ahead circuitry is also coupled with the first memory.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

Particular implementations disclosed herein can provide one or more of the following advantages. Look ahead processing can increase decoder speed, increase decoder throughput, reduce power consumption, or a combination of these. Skipping one or more variable nodes, for example, can reduce time required for convergence, e.g., reduce the number of clock cycles. Further, look ahead processing can be implemented to avoid reading from or writing to variable node memory, which can lead to reduced power consumption, reduced overall decoder complexity, or both.

Details of one or more implementations are set forth in the accompanying drawings and the description below. Other features and advantages may be apparent from the description and drawings, and from the claims.

DRAWING DESCRIPTIONS

FIG. 3 shows a block diagram of an example of a decoder that uses look ahead logic to make scheduling decisions.

Like reference symbols in the various drawings indicate like elements.

DETAILED DESCRIPTION

Figure 1:
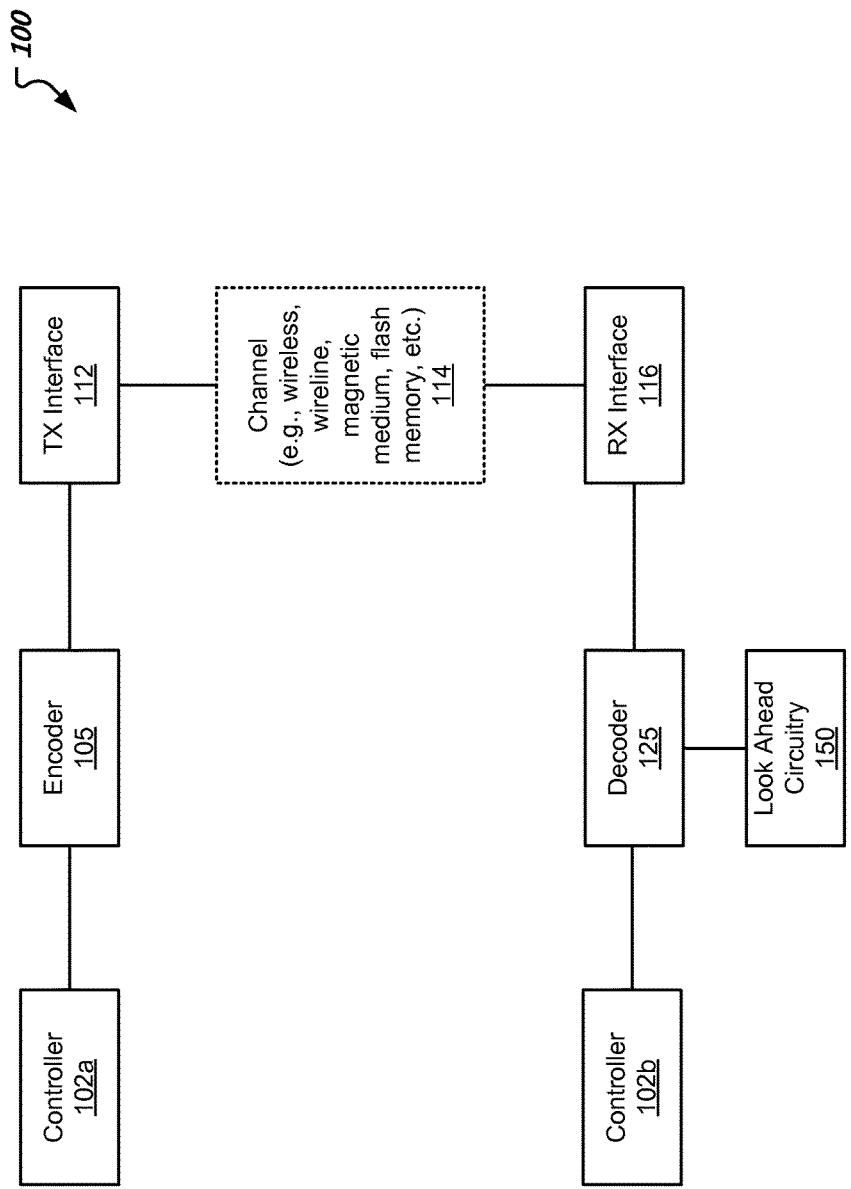
FIG. 1 shows an example of a system that includes a decoder and look ahead circuitry for the decoder.

FIG. 1 shows an example of a system 100 that includes a decoder 125 and look ahead circuitry 150 for the decoder 125. The system 100 can include one or more controllers 102*a-b*, encoder 105, transmit (TX) interface 112, receive (RX) interface 116, decoder 125, and look ahead circuitry 150. A controller 102*a* can generate a message. The encoder 105 can encode at least a portion of the message to produce a codeword. In some implementations, the encoder 105 can include an LDPC encoder. A codeword can include data symbols and parity symbols. In some implementations, each symbol represents a single binary value, e.g., a single bit. For example, a codeword can include one or more data bits and one or more parity bits. In some implementations, each symbol represents a group of two or more bits. In some implementations, each symbol represents one of a plurality of values and can be used for non-binary LDPC codes.

In some implementations, a codeword can include data bits from at least a portion of the message and parity bits that are based on the data bits. In some implementations, the encoder 105 can generate parity bits from data bits based on a matrix such as a generator matrix. The codeword 110 can be transmitted by the TX interface 112. In some implementations, the codeword 110 can be modulated by a modulator in the TX interface 112 into a waveform suitable for transmission or storage on a channel 114. In some implementations, the channel 114 is a wireless or wireline communication channel. In some implementations, the channel 114 is a storage medium such as a magnetic storage medium or a non-volatile memory such as a flash memory structure.

The RX interface 116 can receive information such as a signal from the channel 114. In some implementations, receiving a signal can include receiving a signal from an antenna. In some implementations, receiving a signal can include receiving a signal from a read head of a storage medium or from read logic. In some implementations, the RX interface 116 includes a demodulator to demodulate a received signal. In some implementations, the RX interface 116 includes a detector to detect a received codeword within a demodulated signal. The decoder 125 can be configured to decode a signal. A signal can be represented by a vector. For example, the decoder 125 can decode a vector to find an estimated codeword and produce a decoded message or portion of a message. The decoder 125 can include an LDPC decoder. The decoder 125 can perform decoding by updating symbol values across multiple iterations based on a parity check matrix. A parity check matrix can impose constraints on a vector of symbols. The decoder 125 can determine whether the vector represents a valid codeword based on the parity check matrix. A codeword is valid if all constraints are satisfied. A corrupted codeword typically results in one or more of the constraints being violated, e.g., unsatisfied. In some implementations, the decoder 125 includes a bit flipping decoder that iteratively flips one or more bits in a received codeword based on whether there is a high likelihood that a given bit in its present state is incorrect. For example, a bit that is associated with a high number of unsatisfied constraints can be flipped to attempt to reduce the number of unsatisfied constraints in a subsequent iteration.

Preliminary determinations of variable node and check node values can be initially stored in one or more memories. Such determinations can be produced by a detector. In some implementations, a detector can produce reliability information for each of its preliminary determinations. The decoder 125 can use check node values to update variable node values. The check node values can contain information on whether a constraint is satisfied or unsatisfied. In some implementations, the decoder 125 can use a parity check matrix to generate check node values based on variable node values. The decoder 125 can be configured to update variable nodes, reliability data, check nodes, or a combination thereof based on one or more update rules. For example, an update rule can be based on whether checks of one or more variable nodes are satisfied or unsatisfied, whether the variable node has been previously updated, e.g., flipped, based on the value of the reliability data, or a combination thereof. Based on a termination or a convergence of the decoding process, the decoder 125 can output a decoded message or message part to the controller 102b based on a final version of the array of variable node values. In some implementations, controller 102a includes controller 102b. In some implementations, controller 102a and controller 102b reside on different devices.

The decoder 125 can process one or more variable nodes in the same clock cycle based on an amount of parallelism within the hardware of the decoder 125. A decoding iteration can require one or more clock cycles to complete. The scheduling of variable nodes within the decoder 125 can be based on node selection information produced by look ahead circuitry 150. The look ahead circuitry 150 can be configured to perform look ahead processing, which can be referred to as preprocessing, to determine which variable nodes are to be processed by the decoder 125 in a subsequent clock cycle. For example, while the decoder 125 is processing a group of variable nodes, the look ahead circuitry 150 is preprocessing another group of variable nodes. In some implementations, processing by the decoder 125 can include reading and writing of variable node values and check node values. In contrast, processing by the look ahead circuitry 150 can include reading check node values to determine whether one or more variable nodes are selected for processing in a subsequent clock cycle by the decoder 125. In some implementations, the look ahead circuitry 150 is not required to read or write variable node values, which can result in the look ahead circuitry 150 being less complex than the decoder 125.

Figure 2B:
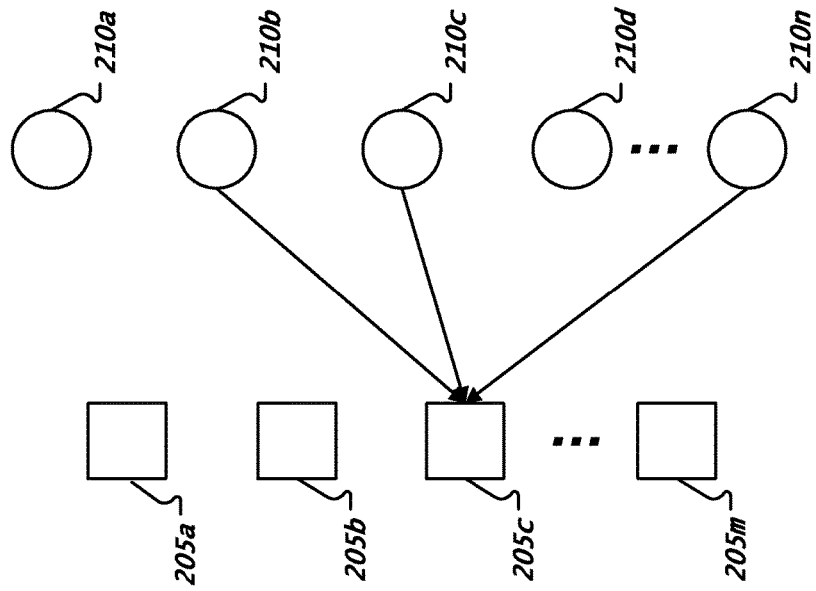
FIGS. 2A and 2B show examples of interactions among variable nodes that are associated with different portions of a codeword and check nodes associated with the variable nodes.
Figure 2A:
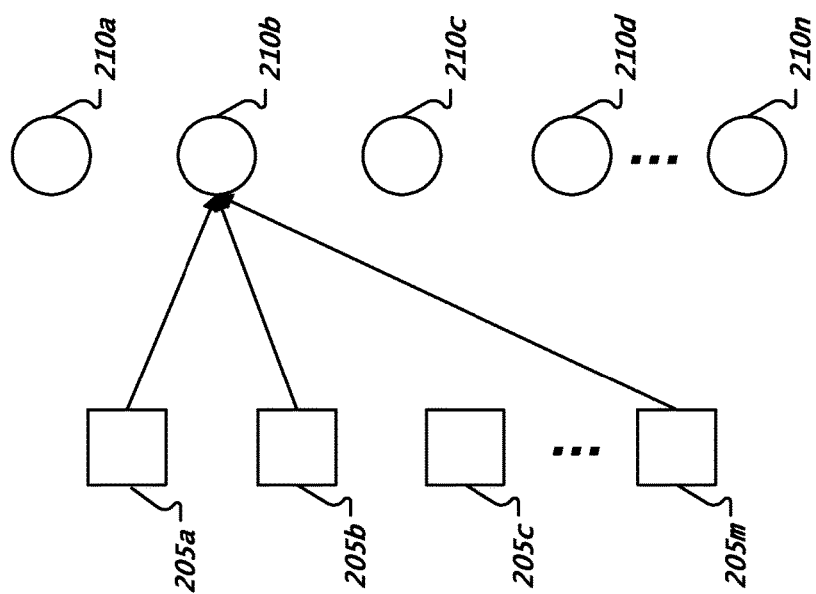

FIGS. 2A and 2B show examples of interactions among variable nodes 210a-n that are associated with different portions of a codeword and check nodes 205a-m associated with the variable nodes 210a-m. The variable nodes 210a-n can correspond to symbols of a codeword. The variable nodes 210a-n and check nodes 205a-m can be elements of a bipartite graph representation of an LDPC code. The nodes 210a-n, 205a-m can be representations of a codeword's symbols and the constraints imposed on the symbols by the LDPC code. Upon initialization of a decoding process, variable nodes 210a-n can be assigned input values based on respective hard decisions. In some implementations, one or more checks of the variable nodes 210a-m can be performed by the decoder 125 by processing rules of a check algorithm to determine whether one or more constraints for one or more groups of the variable nodes 210a-m are satisfied. In this example, the number of check nodes 205a-n is the number of constraints imposed on the variable nodes 210a-m. Further, a check node 205a-n can store an indication status value, where a satisfied status value indicates that a constraint is satisfied and an unsatisfied status value indicates that the constraint is not satisfied.

A parity check matrix H can describe an LDPC code by defining the constraints imposed on groups of symbols within the codeword. A vector of symbols is a valid codeword if and only if all the constraints imposed by H are satisfied by the values in the vector. For example, a parity check matrix H of a binary error correcting code can be as follows:

$$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row of H can correspond to one of the check nodes 205a-m, and each column of H can correspond to one of the variable nodes 210a-n. Note that the number, m, of check nodes and the number, n, of variable nodes can vary with implementation, and so the dimensions of the check matrix H can be different than what is shown above. In any case, the decoder 125 can use a parity check matrix H to identify which variable nodes are checked by a particular check node and how check nodes are updated based on changes to variable nodes. In some implementations, the check nodes 205a-m can include a 1-bit storage, and the variable nodes 210a-m can include a 1-bit storage. In some implementations, a check node 205a-m can include one or more bits for indicating a satisfied or unsatisfied condition status and one or more bits for indicating the reliability of the check node.

FIG. 2A shows an example of a variable node update based on neighboring check node values. In this example, check nodes 205a, 205b, and 205m are neighbors of variable node 210b. In other words, the value of variable node 210b impacts whether constraints associated with check nodes 205a, 205b, and 205m are satisfied or unsatisfied. If the number of unsatisfied check node neighbors is greater than or equal to g, the bit value of variable node 210b can be flipped. Note that g can vary from iteration to iteration. In some implementations, G is a set of threshold values used to determine whether to flip a bit across different iterations: $G=[g_1, g_2, g_3, \ldots ]$, where $g_t$ denotes the threshold value in the t-th iteration.

FIG. 2B shows an example of a check node update based on neighboring variable node values. In this example, variable nodes 210b, 210c, and 210n are neighbors of check node 205c. From the values received from variable nodes 210b, 210c, and 210n, the decoder can determine whether a given constraint for the check node 205c is satisfied or unsatisfied. An indication of whether the check node 205c is satisfied or unsatisfied, e.g., a check node value, can be stored in a memory such as a syndrome memory. In some implementations, the decoder can perform a logic operation on incoming bit-messages, which can be 1-bit messages, from neighboring variable node values.

Properties of a parity check matrix can lend themselves to parallelism. For example, a LDPC parity check matrix can be structured as a block circulant matrix. With a block circulant matrix characteristic, processing in a decoder can be parallelized. For example, a decoder can process $S_c$ variable/check nodes in a single clock cycle, where $S_c$ is the size of a block circulant. In some implementations, the decoder can include two or more processors to handle two or more groups of $S_c$ variable nodes in a clock cycle. Such processors can be utilized, with scheduling and memory addressing, to handle different portions of a parity check matrix in different clock cycles.

A decoder can process one or more block columns, e.g., columns associated with one or more variable nodes, of a parity check matrix in a clock cycle. Typically, few clock cycles result in the flipping of one or more variable nodes. For clock cycles in which no variable nodes are flipped, memories such as hard decision memory, reliability memory, syndrome memory are not updated. Look ahead logic can leverage this lack of flipping. While one or more block columns are being processed in the current clock cycle, the look ahead logic can preprocess one or more block columns that, in prior decoders, would have been processed in one or more subsequent clock cycles. Look ahead processing can include accessing check node values in the syndrome memory to determine whether to process and how to process these particular block columns in the subsequent clock cycle. In some implementations, look ahead processing can include accessing one or more values associated with a variable node in the hard decision memory.

In some implementations, the look ahead logic can preprocess one or more block columns that are being processed elsewhere in the decoder in the same clock cycle to determine whether the one or more block columns are required to be processed again in the subsequent clock cycle. In some implementations, look ahead logic can preprocess one or more block columns that were previously processed or preprocessed. Note that "preprocessing" or "look ahead processing" can refer to operations performed by look ahead logic, in contrast with "processing" or "decoder processing" which can refer to nominal processing performed elsewhere in the decoder.

Some decoders can process block columns $i_1, i_2, i_3, \ldots, i_k$ in the current clock cycle, and can update memories such as hard decision, reliability, and syndrome memory. In these decoders, $i_1, i_2, i_3, \ldots, i_k$ can be consecutive. Further, in these decoders, block columns $i_1+k, i_2+k, i_3+k, \ldots, i_k+k$ can be processed in the subsequent clock cycle.

In a decoder with look ahead logic, block columns $i_1, i_2, i_3, \ldots, i_k$ are not necessarily consecutive and how these columns are selected and processed can depend on results of the look ahead logic generated in a previous clock cycle. In the current clock cycle, block columns $j_1, j_2, j_3, \ldots, j_l$ can be preprocessed by the look ahead logic. In some implementations, there can be overlap in decoder processing and look ahead processing in the same clock cycle. For example, $\{j\}$ and $\{i\}$ can potentially intersect in a clock cycle. In some implementations, $j_1, j_2, j_3, \ldots, j_l$ are not required to be consecutive. The look ahead logic can perform preprocessing by accessing a check node memory without requiring access to a variable node memory. In some implementations, look ahead logic can access variable node memories if required. If the number of unsatisfied check nodes for a variable node is greater than a threshold $g_1$, then this variable node is skipped in the next clock cycle. If the number of unsatisfied check nodes is less than $g_1$ but greater than threshold $g_2$, then the look ahead logic can read a variable node value, a reliability bit associated with the variable node, or both. For example, the value of the reliability bit can determine whether to skip the variable node in the subsequent clock cycle.

The look ahead logic can produce node selection information such as a block control vector u of length l, for example $u=(u_1, u_2, \ldots, u_l)$, where the value of an entry $u_t$ in the vector can control how the block column $j_t$ will be processed in the next clock cycle. For example, a block control vector entry can be a vector itself (a, b) that can take a value in the set $\{0,1,2,3\} \times \{0,1\}$. If the b-value is 0, i.e., $u_t=(x, 0)$, then it indicates that $j_t$ will not be preprocessed by the look ahead logic in the subsequent clock cycle. If the b-value is 1, i.e., $u_t=(x,1)$, then it indicates that $j_t$ will be preprocessed by the look ahead logic in the subsequent clock cycle. In some implementations, $u_t=(0, x)$ indicates that $j_t$ will not be processed in the subsequent clock cycle. In some implementations, $u_t=(1, x)$ indicates that $j_t$ will be processed in the subsequent clock cycle but only the corresponding hard decision memory may be updated. In some implementations, $u_t=(2, x)$ indicates that $j_t$ will be processed in the subsequent clock cycle but only the corresponding reliability memories may be updated. In some implementations, $u_t=(3, x)$ indicates that $j_t$ will be processed in the subsequent clock cycle and both corresponding hard decision and reliability memories may be updated.

In some implementations, information generated by the look ahead logic can be buffered and used in subsequent clock cycles for processing block columns. For example, during preprocessing block column $j_t$, the look ahead logic determines the number of unsatisfied neighbors of each of the variable nodes in $j_t$. This information can be buffered and used in the next clock cycle for processing $j_t$. This can eliminate the need to recalculate the number of unsatisfied neighbors of each of the variable nodes in $j_t$ in the next clock cycle.

In some implementations, the hard decision and the reliability memories can share the same updating logic. For example, if both the hard decision and the reliability memories corresponding to $j_t$ need to be updated, then they can be updated in two clock cycles. A possible scheduling in such a scenario is to process $j_t$ in the current clock cycle to update the hard decision memory, and preprocess $j_t$ in the current clock cycle to control whether, in the next clock cycle, $j_t$ will be processed again and the reliability memories updated.

In some conventional bit-flipping decoders, each block column at one particular time instant operates with some threshold $g_e$ (this threshold may change over decoding steps/iterations). If the number of unsatisfied checks exceeds the threshold for the current bit processed, this bit may be flipped. Otherwise, the bit is not flipped in the current iteration. There are some other thresholds that are used for updating the reliability bits in the same manner. In some implementations, there can be multiple thresholds, some of which can be used to update the reliability bits, for example, if the number of unsatisfied check nodes is greater than threshold A and smaller than threshold B, then flip the reliability bit.

The look ahead logic can use the same methodology to determine whether to process and how to process a block column in the next clock cycle, e.g., by comparing the number of variable nodes' unsatisfied neighbors to one or more threshold values. In some implementations, if the number of unsatisfied checks for any variable node in block column $j_t$ is low (e.g., does not exceed a threshold) based on the current syndrome (e.g., current array of check node values), then the decoder is unlikely to flip any variable node in this block column in the next clock cycle. In such a case, the look ahead logic can provide an indication that the hard decision memory corresponding to $j_t$ will not be updated or read in the next clock cycle. If it is not likely that no reliability bit or hard decision bit can be flipped in the next clock cycle, the look ahead logic can cause the block column to not be processed, e.g., skipped, in the next clock cycle. The look ahead logic can use other methodologies to determine whether to process and how to process a block column in the next clock cycle. For example, the look ahead logic can keep track of how many times a variable node had been flipped.

In some implementations, the look ahead logic can make decisions based on the number of unsatisfied check nodes associated with one or more variable nodes. In some implementations, this decision is made based on a maximum or a minimum number of unsatisfied check nodes of variable nodes in a block column. In some implementations, the look ahead logic can use one or more thresholds to make such decisions. For example, one or more different threshold values based on one or more different states of a variable node can be used. In some implementations, a node can be a "strong" node if its corresponding bit has not been flipped from its original hard decision value. In contrast, a node can be a "weak" node if its corresponding bit has been flipped from its original hard decision value. In some implementations, strong nodes use a high threshold, whereas weak nodes uses a low threshold. In some implementations, the look ahead logic can determine whether a bit has been flipped on a bit-by-bit level, and make the threshold selection on a per-bit basis. In some implementations, the look ahead logic can determine whether any bit in a block column has been flipped. If any of the bits in the block column have been flipped, use the low threshold for the entire block column. In some implementations, the look ahead logic can make a decision based on one or more values from one or more check nodes, one or more variable nodes, or both. Note that the decision based on a set of values can vary from iteration to iteration and from clock cycle to clock cycle.

FIG. 3 shows a block diagram of an example of a decoder 301 that uses look ahead logic to make scheduling decisions. A decoder 301 can include decoder processors 330a-n, look ahead processors 340a-n, variable node memory 310, check node memory 320, controller 350, and scheduler 355. The number of decoder processors 330a-n ($P_1$) in decoder 301 is based on an amount of parallelism built into the decoder. Further, the number of look ahead processors 340a-n ($P_2$) in decoder 301 is based on an amount of parallelism built into the decoder. Note that $P_1$ and $P_2$ can be the same or different. Each of the decoder processors 330a-n and look ahead processors 340a-n can process one or more variable nodes at a time.

The decoder processors 330a-n are coupled with the variable node memory 310 to read, write, and modify variable node values. The decoder processors 330a-n are coupled with the check node memory 320 to read, write, and modify check node values. The scheduler 355 can specify the variable nodes to be processed by respective decoder processors 330a-n in a clock cycle.

The look ahead processors 340a-n are coupled with the check node memory 320 to read check node values. The scheduler 355 can specify the variable nodes to be processed by respective look ahead processors 340a-n in a clock cycle. Each of the look ahead processors 340a-n can retrieve check node values that are associated with their respective specified variable nodes. The look ahead processors 340a-n can produce control outputs based on whether respective variable nodes should be processed by the decoder processors 330a-n in a subsequent clock cycle. In some implementations, the look ahead processors 340a-n can produce control outputs based on whether respective variable nodes should be processed again by a look ahead processor 340a-n. The scheduler 355 can make scheduling decisions based on the control outputs of the look ahead processors 340a-n. In some implementations, a control output can include a value such as a variable node index value or a block column index value.

The controller 350 can control the initialization of one or more memories 310, 320 based on a received codeword. Further, the controller 350 can access a final version of the variable node values to produce a decoded output. The decoder 301 can be implemented using one or more integrated circuit (IC) chips. In some implementations, the decoder processors 330a-n and the look ahead processors 340a-n reside on discrete portions of one or more IC chips. In some implementations, the decoder processors 330a-n and the look ahead processors 340a-n include specialized logic. In some implementations, the decoder processors 330a-n and the look ahead processors 340a-n are general purpose processors running program code to implement the decoding and look ahead algorithms. In some implementations, a multi-core or multi-threaded processor performs the functionality of one or more of the decoder processors 330a-n and the look ahead processors 340a-n in respective threads or cores. In some implementations, the variable node memory 310 and the check node memory 320 reside on separate memory structures such separate memory integrated circuits. In some implementations, the variable node memory 310 and the check node memory 320 reside in different portions of a shared memory structure.

Figure 4:
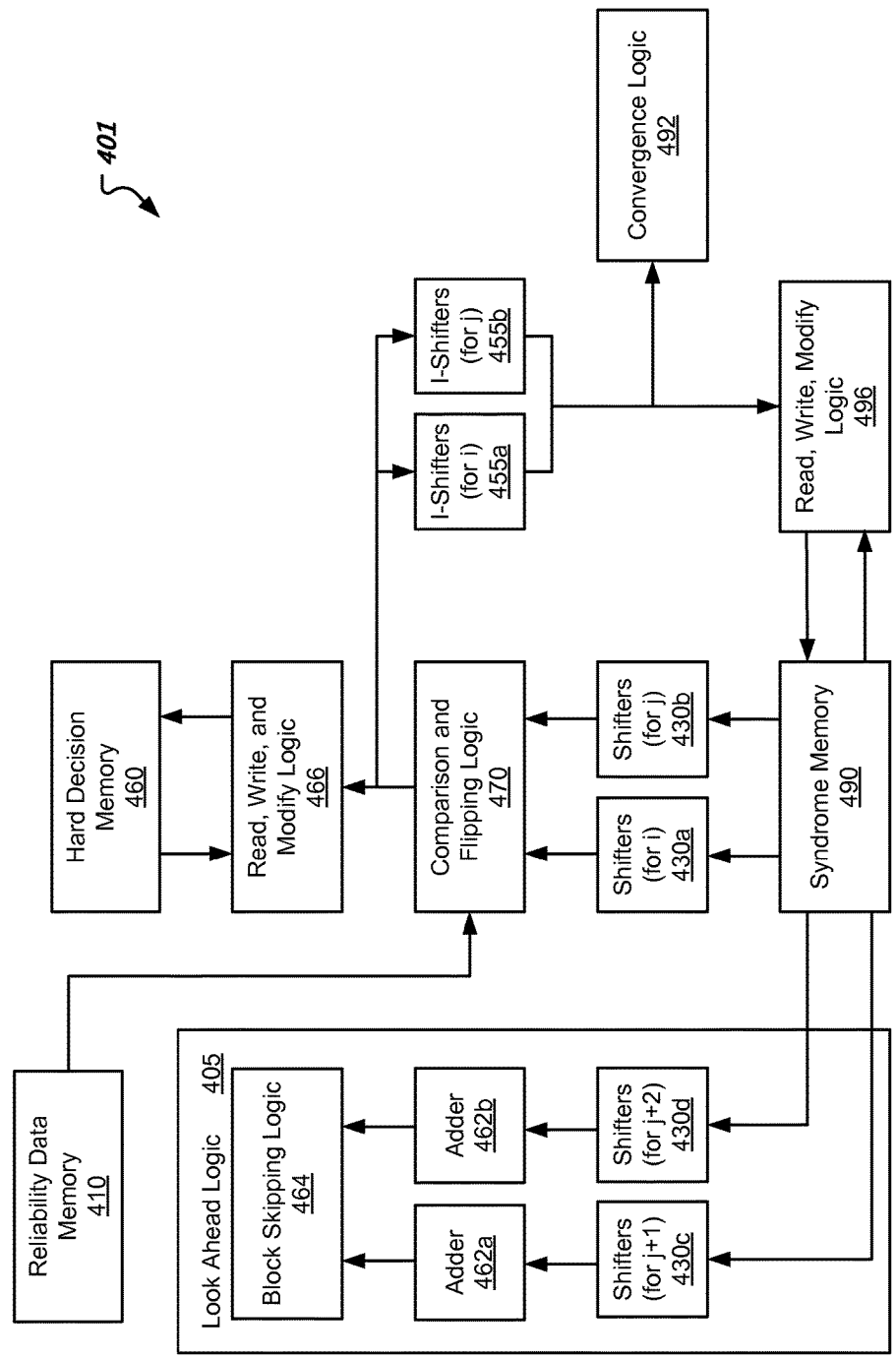
FIG. 4 shows a block diagram of another example of a decoder that uses look ahead logic to make scheduling decisions.

FIG. 4 shows a block diagram of another example of a decoder 401 that uses look ahead logic 405 to make scheduling decisions. The decoder 401 includes memories such as reliability memory 410, hard decision memory 460 for variable nodes, and syndrome memory 490 for check nodes. To selectively update variable node values, the decoder 401 includes comparison and flipping logic 470 that is configured to make and output one or more flip decisions associated with one or more variable nodes. In some implementations, flip decisions are commands to flip a bit associated with a variable node. In some implementations, flip decisions includes updated values. Updated variable node values can be provided to the read, write, and modify logic 466. The read, write, and modify logic 466 can include a memory controller configured to write updated variable node values to the hard decision memory 460.

Based on requests from the syndrome read, write, and modify logic 496, the syndrome memory 490 can provide check node values to shift blocks 430a-b. Shift blocks 430a-b can receive check node values from the syndrome memory 490 and provide outputs to the comparison and flipping logic 470. The shift blocks 430a-b are configured such that the check node values associated with each variable node selected for processing in a clock cycle are aligned for tallying the number of unsatisfied check node values. In some implementations, the comparison and flipping logic 470 can compute the number of unsatisfied check node values per each variable node in a given block column based on the output of a shift block 430a-b. The shift blocks 430a-b can operate on different block columns in the same clock cycle. In some implementations, the shift blocks 430a-b are included in different decoder processors.

Updated variable node values from the comparison and flipping logic 470 can be provided to inverse shift blocks 455a-b such that zero or more check node values can be updated. Updated check node values can be provided to the syndrome read, write, and modify logic 496, which can write the values to the syndrome memory 490. Further, the inverse shift blocks 455a-b can provide updated check node values to convergence logic 492. Convergence logic 492 can be configured to use one or more convergence or termination conditions to determine whether decoding has converged or whether termination of the decoding process is appropriate. For example, if an all-zero syndrome (e.g., all check node values are zero) is achieved, or if a maximum iteration number $t_{max}$ is reached, convergence logic 492 can declare that decoding is terminated.

The look ahead logic 405 can provide information such as node selection information which can be used by the decoder 401 to make scheduling decisions. The look ahead logic 405 can receive check node values from the syndrome memory 490. The shift blocks 430c-d in the look ahead logic 405 can shift and align check node values such that they can be properly summed by the adders 462a-b. The adders 462a-b tally the number of unsatisfied check node values for respective variable nodes. Using the shift blocks 430c-d and adders 462a-b, the look ahead logic 405 can determine the number of unsatisfied check nodes for each variable node being examined by the look ahead logic 405. In some implementations, the shift blocks 430c-d and adders 462a-b operate on respective block columns. The adders 462a-b can provide tallies of the number of unsatisfied check nodes per variable node to block skipping logic 464. The block skipping logic 464 can produce node selection information based on the tallies received from the adders 462a-b. In some implementations, the decoder 401 can include a controller (not shown) that is coupled with the convergence logic 492 and the look ahead logic 405. The controller can use the node selection information to schedule variable nodes for processing or preprocessing within the decoder 401.

In the decoder 401, 2*P variable nodes can be updated in parallel, which includes P variable nodes for the i-th block and P variable nodes for the j-th block. The comparison and flipping logic 470 can provide 2*P bit flip decisions per clock cycle. Each variable node can be selectively updated based on two more check node values. In some implementations, the variable-node degree $d_v$ parameter provides the maximum number of check nodes required to update a variable node. Each of the shift blocks 430a-d can shift $d_v$*P values. In some implementations, the shift blocks 430a-b allow check node values to be aligned with different offsets relative to lookup tables implemented by comparison and flipping logic 470. In some implementations, shift blocks 430a-b can be positioned between the syndrome memory 490 and the comparison and flipping logic 470 so that the check node values associated with each variable node are aligned for tallying the number of unsatisfied check nodes and for comparing to a lookup table. In some implementations, inverse shift blocks 455a-b can be positioned between the comparison and flipping logic 470 and the syndrome read, write, and modify logic 496 for reversing the shifting performed by the shift blocks 430a-b, such that updated check node values can be determined and written to the syndrome memory 490 in a predetermined order.

The reliability memory 410 includes one or more initial received reliability values, e.g., a 1-bit reliability value for a corresponding variable node. In some implementations, the reliability memory 410 is not updated during decoding. The comparison and flipping logic 470 can use one or more reliability values in determining whether to flip a variable node. In some implementations, the reliability value is used to determine a threshold that controls the flip determination.

The comparison and flipping logic 470 can determine whether a current hard decision for a variable node matches a corresponding initial received value from reliability memory 410. In some implementations, a variable node whose current hard decision matches its corresponding initial received value is considered to be strong, otherwise it is considered to be weak. There are two thresholds, for example, for flipping variable nodes per iteration: one for strong variable nodes and one for weak variable nodes.

In the t-th clock cycle, block columns i and j (i+3>j>i) are processed with areas within the hard decision memory 460 that correspond to i and j being updated and the syndrome memory 490 being updated. Also in the t-th clock cycle, block columns j+1, j+2 are preprocessed by the look ahead logic 405. In some implementations, the look ahead logic 405 can use the current syndrome vector to determine the maximum numbers of unsatisfied neighbors of variable nodes in block column j+1 and in block column j+2.

By comparing these maximum numbers of unsatisfied neighbors with the appropriate thresholds, the look ahead logic 405 decides whether to process j+1 and j+2 in the next clock cycle. In some implementations, if the maximum number of unsatisfied neighbors of every variable node in j+1 is less than the appropriate threshold, then j+1 can be skipped in the next clock cycle.

The decoder 401 can maintain one or more flags to indicate whether there is at least one weak variable node associated with a block column. The look ahead logic 405 can use these one or more flags to determine the appropriate threshold for comparison. The block skipping logic 464 can determine whether to skip a block in the next clock cycle. For example, if j+1 and j+2 are to be skipped then in the next clock cycle: i'=j+3 and j'=j+4, where i' is the updated value of i. If only j+1 is to be skipped then in the next clock cycle: i'=j+2 and j'=j+3. If only j+2 is to be skipped then in the next clock cycle: i'=j+1 and j'=j+3.

Figure 5A:
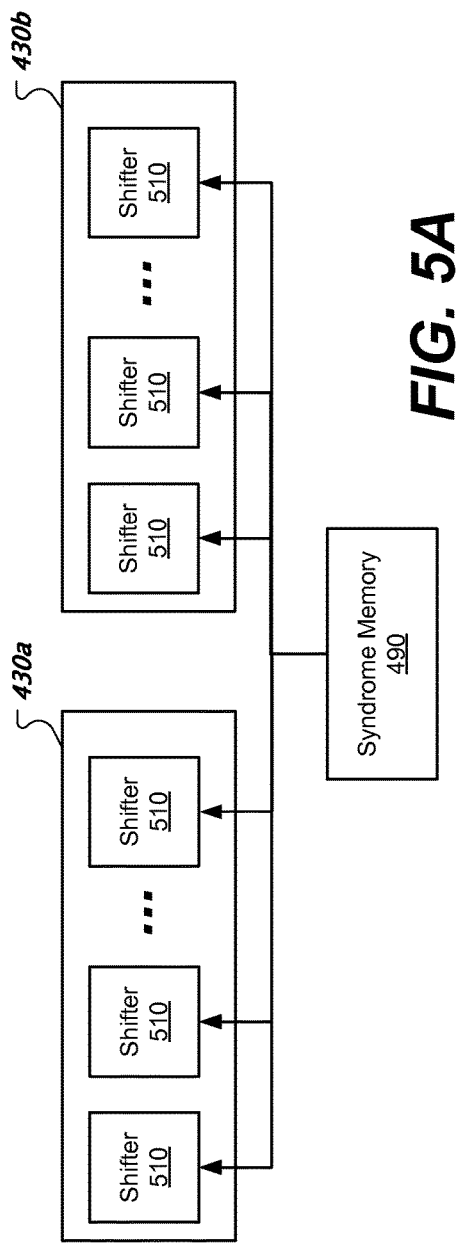
FIG. 5A shows an example of a shift block associated with the decoder of FIG. 4.

FIG. 5A shows an example of a shift block associated with the decoder of FIG. 4. The shift blocks 430a-b can each include multiple shifters 510. The number of shifters 510 in a shift block 430a-b can be equal to the variable-node degree $d_v$ parameter. The shifters 510 can perform shifts in parallel, for a total of $d_v$*P shifts per shift block 430a-b. In some implementations, each shifter 510 can perform one shift operation on a group of P variable nodes. Based on an input vector $v_{in}=[v_0, v_1, \ldots, vp_{P-1}]$, a shifter 510 can shift vector elements by one to the left to produce an output vector $v_{out}=[v_1, v_2, \ldots, v_{P-1}, v_0]$. In some implementations, the syndrome memory 490 includes a multi-port memory to provide values, in parallel, to the shifters 510 of the shift blocks 430a-b. Note that shift blocks 430c-d of the look ahead logic 405 can be similar to shift blocks 430a-b.

Figure 5B:
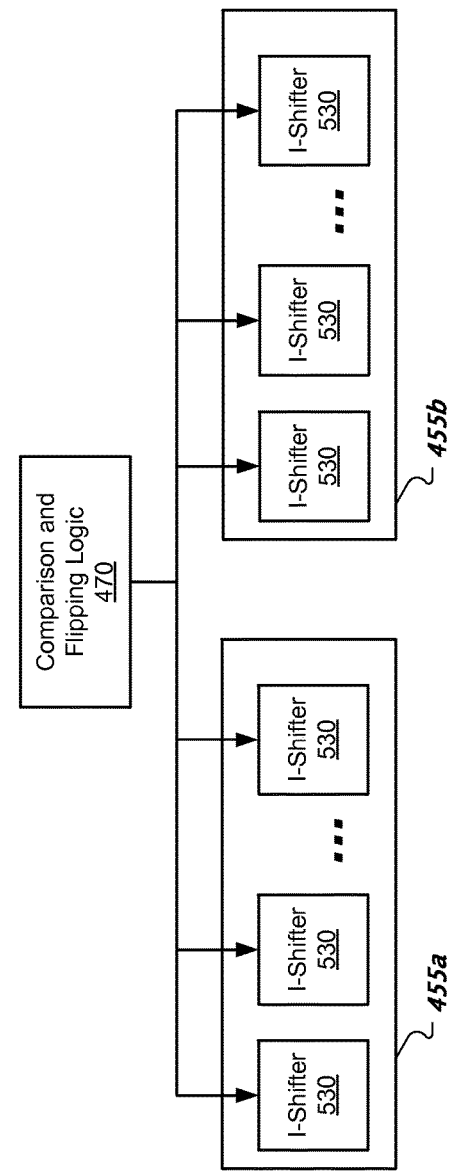
FIG. 5B shows an example of an inverse shift block associated with the decoder of FIG. 4.

FIG. 5B shows an example of an inverse shift block associated with the decoder of FIG. 4. The comparison and flipping logic 470 can provide variable node values, include any updated variable node values, to the inverse shift blocks 455a-b. In some implementations, the comparison and flipping logic 470 includes a multi-port memory to provide values in parallel to the inverse shift blocks 455a-b. The inverse shift blocks 455a-b can each include multiple inverse shifters 530. The number of inverse shifters 530 in an inverse shift block 455a-b can be equal to the variable-node degree $d_v$ parameter. Each of the inverse shifters 530 can perform P inverse shifts in parallel, for a total of $d_v$*P shifts per shift block.

Figure 6:
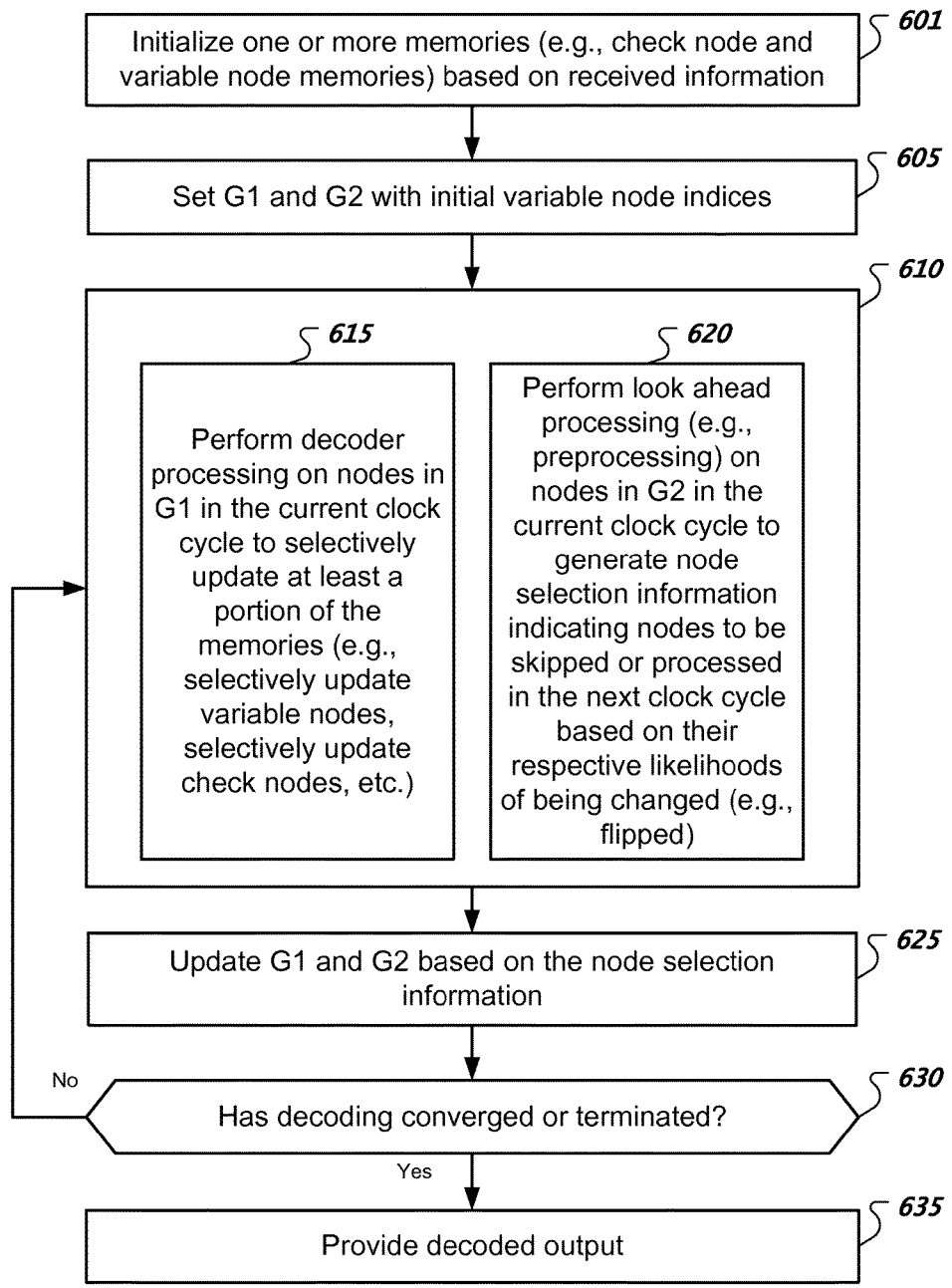
FIG. 6 shows an example of a process for decoding received information that includes decoder processing and look ahead processing.

FIG. 6 shows an example of a process for decoding received information that includes decoder processing and look ahead processing. At 601, the process initializes one or more memories based on a received information. The received information can include samples of a received signal obtained through a source such as a read head, read logic, or wireless or wireless communication receiver. Initializing memories can include writing initial variable node values to a memory for storing variable node values. The initial variable node values can represent an initial hard decision of the received information. In some implementations, initializing memories can include writing initial check node values to a memory for storing check node values. At 605, the process sets G1 and G2 with initial variable node indices. In this example, G1 is the set of variable nodes to be processed by a decoder in a clock cycle, and G2 is the set of variable nodes to be processed by the look ahead circuitry. The number of indices in G1 can be based on the amount of parallelism within the decoder. The number of indices in G2 can be based on the amount of parallelism within the look ahead circuitry.

At 610, the process performs decoder processing at 615 and look ahead processing at 620 in parallel. For example, the process, at 610, can include operating decoder circuitry and look ahead circuitry in parallel. In some implementations, the process can include operating one or more programmable processors. In some implementations, one or more programmable processors can be programmed with program code that implements decoder processing and look ahead processing.

At 615, the process performs decoder processing on nodes in G1 in the current clock cycle to selectively update at least a portion of the memories (e.g., selectively update variable nodes, selectively update check nodes, etc.). In some implementations, decoder processing can include processing, for indices in G1, each variable node value according to one or more variable value update rules, neighboring check node values, variable node reliability data, or a combination thereof. In some implementations, a variable node that neighbors a check node is a variable node that has a connection to the check node based on a parity check matrix. Decoder processing can include updating check node values based on neighboring variable nodes, which can be performed after or concurrently with variable node updates. In some implementations, updated check node values can be recomputed from updated variable values. In some implementations, check node values can be updated from portions of flip decisions that correspond to variable nodes associated with or connected to the particular check node under consideration.

At 620, the process performs look ahead processing (e.g., preprocessing) on nodes in G2 in the current clock cycle to generate node selection information indicating nodes to be skipped or processed in the next clock cycle based on their respective likelihoods of being changed (e.g., flipped). In some implementations, a likelihood of being changed is based one whether one or more bits of a variable node will likely be flipped in the next clock cycle, which can be based on unsatisfied conditions associated with the variable node. Look ahead processing can include, for each variable node in G2, accessing check node values that are associated with the variable node, determining the number of unsatisfied conditions based on the check node values associated with the variable node, and determining whether to skip or process the variable node in the next clock cycle based on the number of unsatisfied conditions. The likelihood of a variable node being flipped in a subsequent clock cycle can be related to the number of unsatisfied conditions associated with the variable node. If the likelihood that the variable node will be flipped exceeds a threshold value, then the node's corresponding index value can be included in the node selection information as a node to be processed. At 625, the process updates G1 and G2 based on the node selection information. In some implementations, G1 is updated to include one or more nodes marked for processing based on the node selection information. G2 can be updated with the next group of variable node indices to be preprocessed. In some implementations, G2 is updated based on whether one or more of the nodes in G2 are selected to repeat look ahead processing.

At 630, the process determines whether decoding has converged or terminated. In some implementations, decoding converges when all check nodes report satisfied conditions, which can be when all updated variable nodes satisfy constraints imposed by a parity check matrix. In some implementations, decoding terminates when a maximum number of decoding iterations is reached. If decoding has not converged or terminated, then the process continues at 610 to perform one or more additional rounds of decoder and look ahead processing. If decoding has converged or terminated, then the process at 635, provides a decoded output. The decoded output can include a final version of the variable nodes or a portion thereof.

Figure 7:
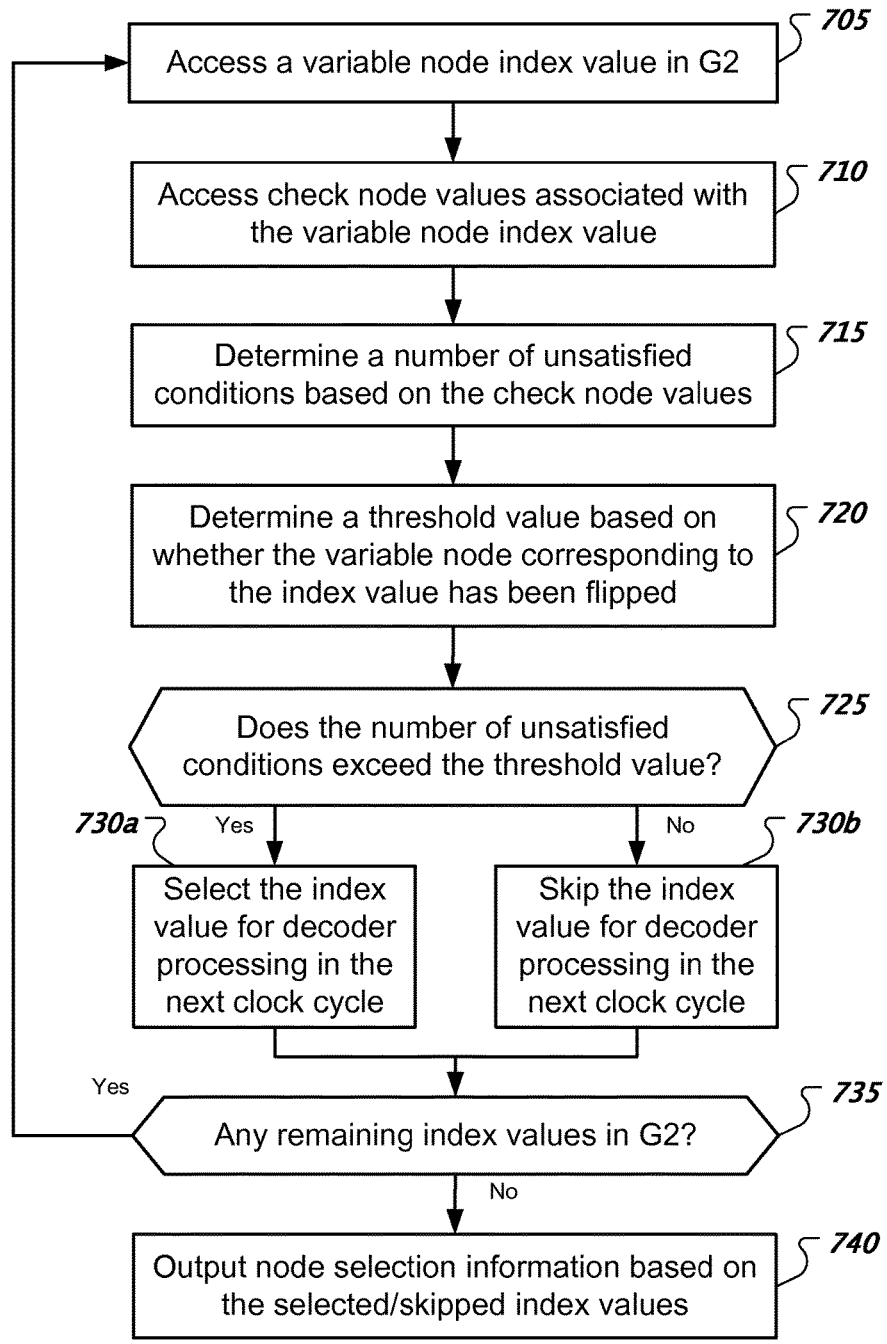
FIG. 7 shows an example of a process for look ahead processing.

FIG. 7 shows an example of a process for look ahead processing. At 705, the process accesses a variable node index value in G2. The process can be parallelized. For example, two or more, if not all of the variable node index values in G2 can be processed in parallel as per the following operations in the same clock cycle. At 710, the process accesses check node values associated with the variable node index value. At 715, the process determines a number of unsatisfied conditions based on the check node values. In some implementations, the process can determine a number of satisfied conditions based on the check node values.

At 720, the process determines a threshold value based on whether the variable node corresponding to the index value has been flipped. Determining a threshold can include selecting a threshold from a group of thresholds. A high threshold, for example, can be selected if the variable node is a "strong" node that has experienced few to zero flips in the previous decoder iterations. A low threshold, for example, can be selected if the variable node is a "weak" node that has experienced few to many flips in the previous decoder iterations. The number of flips separating a strong node and a weak node designation can be predetermined. In some implementations, the process can mark whether a node is strong or weak such that a respective high or low threshold value can be selected.

At 725, the process determines whether the number of unsatisfied conditions exceeds the threshold value. If exceeded, the process, at 730a, selects the index value for decoder processing in the next clock cycle. If not exceeded, the process, at 730b, skips the index value for decoder processing in the next clock cycle. At 735, the process determines whether there are any remaining index values in G2. If there is a remaining index value, the process continues at 705 to handle the remaining index value. If there are no more remaining index values, the process at 740, outputs node selection information based on the included/skipped index values. In some implementations, node selection information can include zero or more index values for skipped nodes, and zero or more index values for selected nodes.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Other embodiments fall within the scope of the following claims.

What is claimed is:

1. An apparatus comprising:
a first memory to store values for variable nodes associated with received information associated with a codeword;
a second memory to store values for check nodes associated with the variable nodes;
decoder circuitry coupled with the first memory and the second memory, and configured to selectively update the variable nodes and the check nodes to decode the received information, wherein the decoder circuitry is configured to selectively update a first group of the variable nodes and a first group of the check nodes in a first clock cycle; and
look ahead circuitry coupled with the second memory and the decoder circuitry, wherein the look ahead circuitry is configured to access, in the first clock cycle, a second group of the check nodes that are associated with a second group of the variable nodes, and generate node selection information based on the second group of the check nodes,
wherein the node selection information indicates whether one or more variable nodes of the second group of the variable nodes are to be skipped or processed by the decoder circuitry in a second clock cycle based on their respective one or more likelihoods of being changed.

2. The apparatus of claim 1, wherein the look ahead circuitry is configured to:
access, from the second memory, check node values that are associated with a target variable node of the second group of the variable nodes,
determine a number of unsatisfied conditions based on the check node values associated with the target variable node, and
determine whether to skip or process the target variable node in the second dock cycle based on the number of unsatisfied conditions.

3. The apparatus of claim 2, wherein the look ahead circuitry is configured to:
cause the target variable node to be processed by the decoder circuitry in the second clock cycle based on the number of unsatisfied conditions exceeding a threshold value, and
cause the target variable node to be skipped by the decoder circuitry in the second clock cycle based on the number of unsatisfied conditions not exceeding the threshold value.

4. The apparatus of claim 3, wherein the look ahead circuitry is configured to:
determine the threshold value based on whether the target variable node was changed in a previous dock cycle.

5. The apparatus of claim 1, wherein the decoder circuitry is configured to perform low density parity check (LDPC) decoding on the received information.

6. The apparatus of claim 1, comprising an integrated circuit chip, wherein the integrated circuit chip comprises the decoder circuitry and the look ahead circuitry.

7. A method comprising:
operating a decoder to selectively update a first group of variable nodes and a first group of check nodes in a first clock cycle to decode received information associated with a codeword, wherein the variable nodes are associated with the codeword, and wherein the check nodes are associated with the variable nodes;
accessing, in the first clock cycle, a second group of the check nodes that are associated with a second group of the variable nodes;
generating node selection information based on the second group of the check nodes, wherein the node selection information indicates whether one or more variable nodes of the second group of the variable nodes are to be skipped or processed by the decoder in a second clock cycle based on their respective one or more likelihoods of being changed; and
operating the decoder based on the node selection information in the second clock cycle to continue to decode the received information.

8. The method of claim 7, wherein generating the node selection information comprises:
accessing check node values that are associated with a target variable node of the second group of the variable nodes,
determining a number of unsatisfied conditions based on the check node values associated with the target variable node, and
determining whether to skip or process the target variable node in the second clock cycle based on the number of unsatisfied conditions.

9. The method of claim 8, comprising:
causing the target variable node to be processed by the decoder in the second clock cycle based on the number of unsatisfied conditions exceeding a threshold value; and
causing the target variable node to be skipped by the decoder in the second clock cycle based on the number of unsatisfied conditions not exceeding the threshold value.

10. The method of claim 9, wherein generating the node selection information comprises determining the threshold value based on whether the target variable node was changed in a previous clock cycle.

11. The method of claim 7, wherein the decoder is configured to perform low density parity check (MPG) decoding on the received information.

12. The method of claim 7, wherein the received information is associated with a storage medium, wireless medium, or wireline medium.

13. The method of claim 7; wherein generating the node selection information comprises accessing one or more variable node values.

14. A system comprising:
circuitry to receive information associated with a codeword;
a memory to store values for variable nodes associated with the information associated with the codeword and values for check nodes associated with the variable nodes; and
a decoder coupled with the circuitry and configured to use variable nodes, wherein the decoder comprises decoder circuitry and look ahead circuitry,
wherein the decoder circuitry is configured to selectively update the variable nodes and the check nodes to decode the information associated with the codeword, wherein the decoder circuitry is configured to selectively update a first group of the variable nodes and a first group of the check nodes in a first clock cycle, wherein the look ahead circuitry is configured to access, in the first clock cycle, a second group of the check nodes that are associated with a second group of the variable nodes, and generate node selection information based on the second group of the check nodes, wherein the node selection information indicates whether one or more variable nodes of the second group of the variable nodes are to be skipped or processed by the decoder circuitry in a second clock cycle based on their respective one or more likelihoods of being changed.

15. The system of claim 14, wherein the look ahead circuitry is configured to:
   access check node values that are associated with a target variable node of the second group of the variable nodes,
   determine a number of unsatisfied conditions based on the check node values associated with the target variable node, and
   determine whether to skip or process the target variable node in the second clock cycle based on the number of unsatisfied conditions.

16. The system of claim 15, wherein the look ahead circuitry is configured to:
   cause the target variable node to be processed by the decoder circuitry in the second clock cycle based on the number of unsatisfied conditions exceeding a threshold value, and
   cause the target variable node to be skipped by the decoder circuitry in the second clock cycle based on the number of unsatisfied conditions not exceeding the threshold value.

17. The system of claim 16, wherein the look ahead circuitry is configured to:
   determine the threshold value based on whether the target variable node was changed in a previous clock cycle.

18. The system of claim 14, wherein the decoder circuitry is configured to perform low density parity check (LDPC) decoding on the information associated with the codeword.

19. The system of claim 14, wherein the memory comprises a first memory associated with the variable nodes and a second memory associated with the check node, and wherein the look ahead circuitry is coupled with the second memory.

20. The system of claim 19, wherein the look ahead circuitry is coupled with the first memory.

* * * * *